United States Patent
Zhang

(10) Patent No.: US 6,239,598 B1
(45) Date of Patent: May 29, 2001

(54) PROCESS FOR RAPID SAMPLE TRAJECTORY CALIBRATION FOR MAGNETIC RESONANCE IMAGING

(75) Inventor: Yantian Zhang, Rockville, MD (US)

(73) Assignee: The UAB Reasearch Foundation, Birmingham, AL (US)

( * ) Notice: Subject to any disclaimer, the term of this patent is extended or adjusted under 35 U.S.C. 154(b) by 0 days.

(21) Appl. No.: 09/306,933

(22) Filed: May 7, 1999

Related U.S. Application Data

(60) Provisional application No. 60/084,687, filed on May 8, 1998.

(51) Int. Cl.[7] ............................................. G01V 3/00
(52) U.S. Cl. ................................... 324/309; 324/307
(58) Field of Search ............................ 324/309, 307, 324/306, 312, 314, 300

(56) References Cited

U.S. PATENT DOCUMENTS

| | | | |
|---|---|---|---|
| Re. 35,656 | 11/1997 | Feinberg et al. | 324/309 |
| 5,043,665 | 8/1991 | Kuhara et al. | 324/309 |
| 5,151,656 | 9/1992 | Maier et al. | 324/309 |
| 5,270,654 | 12/1993 | Feinberg et al. | 324/309 |
| 5,271,399 | 12/1993 | Listerud et al. | 128/653.3 |
| 5,317,262 | 5/1994 | Moonen et al. | 324/309 |
| 5,341,099 | 8/1994 | Suzuki | 324/309 |
| 5,361,028 | 11/1994 | Kanayama et al. | 324/309 |
| 5,394,872 | 3/1995 | Takiguchi et al. | 128/653.2 |
| 5,432,447 | 7/1995 | Song | 324/309 |
| 5,502,384 | 3/1996 | Nakaya et al. | 324/309 |
| 5,510,711 | 4/1996 | Molyneaux et al. | 324/309 |
| 5,594,336 | 1/1997 | Gullapalli et al. | 324/309 |
| 5,602,476 | 2/1997 | Liu et al. | 324/309 |
| 5,621,321 | 4/1997 | Liu et al. | 324/309 |
| 5,672,969 * | 9/1997 | Zhou et al. | 324/309 |
| 5,680,045 | 10/1997 | Feinberg | 324/309 |
| 5,685,305 | 11/1997 | Moonen et al. | 128/653.3 |
| 5,742,163 * | 4/1998 | Liu et al. | 324/309 |

OTHER PUBLICATIONS

Buonocore et al. "Ghost Artifact Reduction for Echo Planar Imaging Using Image Phase Correction" MRM 38:89–100 (1997).

Reeder et al. "Quantification and Reduction of Ghosting Artifacts in Interleaved Echo–Planar Imaging" MRM 38:429–439 (1997).

Jackson et al. "Selection of a Convolution Function for Fourier Inversion Using Gridding" IEEE Transactions on Medical Imaging, vol. 10, No. 3, Sep. 1991, pp. 473–478.

Reese et al. "MR Gradient Response Modeling to Ensure Excitation Coherence" JMRI, Jul./Aug. 1994, pp. 569–576.

Guclu et al. "A Hardware for Real–time K–space Mapping" p. 1405.

Luh et al. "Single–Shot Spiral Imaging of the Human Head Using a Local Head Gradient Coil" p. 621.

Lee et al. "A Practical Measure of EPI Gradient Shapes Using the FID Signals" p. 1388.

Mason et al. "A Method to Measure Arbitrary k–Space Trajectories for Rapid MR Imaging" (1997) pp. 492–496.

(List continued on next page.)

Primary Examiner—Louis Arana
(74) Attorney, Agent, or Firm—Gifford, Krass, Groh, Sprinkle, Anderson & Citkowski, P.C.

(57) ABSTRACT

A k-space trajectory measurement method is disclosed with applications in magnetic resonance spectroscopy. Phase shift values associated with magnetic resonance signals from multiple sample regions are compared to rapidly extract k-space trajectory measurements. The efficiency of the present invention for image gradients to be measured immediately before test imaging.

13 Claims, 6 Drawing Sheets

OTHER PUBLICATIONS

Papadakis et al. "A General Method for Measurement of the Time Integral of Variant Magnetic Field Gradients: Application to 2D Spiral Imaging" Magnetic Resonance Imaging, vol. 15, No. 5, pp. 567–578 (1997).

Kerr et al. "Image Quality for Spiral–Based Sequences" p. 622.

Alley et al. "A Fourier–transform approach for k–space trajectory measurement" p. 1406.

Takahashi et al. "Compensation of Multi–Dimensional Selective Excitation Pulses Using Measured k–Space Trajectories" MRM 34:446–456 (1995).

Onodera et al. "A method of measuring field–gradient modulation shapes. Application to high–speed NMR spectroscopic imaging" J. Phys. E: Sci. Instrum. 20 (1987) pp. 416–419.

Mandeville et al. "Reduction of Eddy–Current Induced Nyquist Ghosts and Samping Artifact" p. 613.

Jehenson et al. "Analytical Method for the Compensation of Eddy–Current Effects Induced by Pulsed Magnetic Field Gradients in NMR Systems" Journal of Magnetic Resonance 90, 264–278 (1990).

van Vaals et al. "Optimization of Eddy–Current Compensation" Journal of Magnetic Resonance 90, 52–70 (1990).

Morich et al. "Exact Temporal Eddy Current Compensation in Magnetic Resonance Imaging Systems" IEEE Transactions on Medical Imaging, vol. 7, No. 3, Sep. 1988, pp. 247–254.

Spielman et al. "Spiral Imaging on a Small–Bore System at 4.7T" MRM 34:580–585 (1995).

Hughes et al. "Intensity Artifacts in MRI Caused by Gradient Switching in an Animal–Size NMR Magnet" Magnetic Resonance in Medicine 25, 167–179 (1992).

Ahn et al. "Analysis of the Eddy–Current Induced Artifacts and the Temporal Compensation in Nuclear Magnetic Resonance Imaging" IEEE Transactions on Medical Imaging, vol. 10, No. 1, Mar. 1991, pp. 47–52.

Howseman et al. "Improvements in snap–shot nuclear magnetic resonance imaging" The British Journal of Radiology, 61, 822–828 (1988).

\* cited by examiner

PROCESS FOR RAPID SAMPLE TRAJECTORY CALIBRATION FOR MAGNETIC RESONANCE IMAGING

RELATED APPLICATION

This patent application claims priority of provisional patent application 60/084,687, filed May 8, 1998, entitled "Process for Rapid Sample Trajectory Calibration for Magnetic Resonance Imaging."

BACKGROUND OF THE INVENTION

1. Field of the Invention

The present invention relates to a process for producing magnetic resonance images using actual sample trajectories to produce images without errors caused by sampling errors in the spatial frequency space (the k-space). The invention permits the measuring of magnetic resonance imaging sample trajectories in situ from the imaged subject or patient directly and efficiently. The process measures the k-space trajectory using phase values of acquired magnetic resonance signals.

2. Description of the Prior Art

The process of producing images based on readings from magnetic resonance equipment and a number of k-space calibration approaches have been described in both patents and printed literature (1–5). One prior method calibrates the test gradient waveforms using self-encoding gradients. This prior method measures k-space trajectory by analyzing the temporal locations of echo peaks produced by the combination of self-encoding gradients and a test gradient waveform.

Another prior approach measures the actual k-space trajectories by recording signals from a small phantom at a number of locations inside the imaging field (5–8). The time varying magnetic field at the probe location is recorded via phase differences of the acquired data and k-space trajectories are then obtained by solving a set of linear equations.

Still another prior art technique for measuring the actual sample trajectories involves measuring the driving currents of gradient amplifiers (9, 10). Other techniques currently being researched include an approach which establishes landmarks in the k-space by applying short radio frequency pulses at selected times during the k-space traversal (11). Actual k-space trajectories are then determined from the established landmarks.

There have also been many patents in the field of magnetic resonance imaging utilizing information derived from k-space. U.S. Pat. No. 5,621,321 entitled "Magnetic Resonance Scan Calibration Method for Ultra Fast Image Acquisition" describes a method in which data lines are one-dimensionally transformed into a frequency encoded direction. Other techniques have been used for producing images from magnetic resonance techniques such as the technique using gradient echoes and spin echoes or (Grase). This technique, however, selectively phase encodes and time shifts the echo responses and occurrence so as to smoothly distribute unwanted phase shift from field inhomogeneity and/or chemical phase shift effects over the phase encoded dimension in k-space. U.S. Pat. Nos. 5,680,045 and 5,270,654 utilized this Grase technique.

Each of the prior mentioned approaches has its shortcomings. The self-encoding approach takes a long time, and its accuracy is dependent on the accuracy of realized self-encoding gradient amplitude. Gradient performance non-linearity is not accounted for. The RF landmark method is also time consuming and because of the limits in the temporal resolution of the RF impulses and limits on the RF energy deposition, only a few k-space locations are marked during each acquisition. Large numbers of repetitions are necessary to measure an entire k-space trajectory. The small phantom method requires separate phantom experiments and the gradient current monitoring does not account for eddy currents.

Magnetic resonance images are reconstructed from discrete samples of the imaged object's distribution in the spatial frequency domain (the k-space). Actual sampling trajectory in the k-space often deviates from that specified by the ideal spatial encoding gradient waveforms due to imperfections in gradient amplifier performance, readout timing errors, and eddy currents induced by gradient pulses. The resulting misregistrations in k-space sample locations cause image artifacts and distortions in images reconstructed using ideal k-space sample locations. Echo planar imaging, fast spiral scan MRI, and other fast non-Cartesian scan MRI techniques that are widely used in many important imaging applications such as functional brain imaging, interventional imaging, etc., are especially susceptible to this type of image errors.

Modern magnetic resonance scanners use actively shielded gradients and electronic compensation measures to reduce and compensate for induced eddy currents. Despite these corrections, substantial k-space sample trajectory deviations still exist, especially for fast imaging applications that require fast gradient switching and/or ramping (e.g., echo planar imaging) or, use complicated non-Cartesian sampling patterns (e.g., spiral scanning magnetic resonance imaging). In the former case, gradient amplifiers may be driven into a nonlinear operating range causing gradient waveform distortions and thereby k-space sample trajectory deviations. In the latter case, the use of complicated non-Cartesian scan patterns makes eddy current compensation by common measures, mostly adjusted for proper compensation of trapezoidal waveforms, less effective. In most of these cases, due to higher than normal sampling rates, image errors caused by readout timing errors are amplified.

Effects of k-space sample location misregistration can be corrected by reconstructing images using the actual k-space trajectories by regridding interpolation and Fast Fourier Transforms (FFT) (12). Because of aforementioned shortcomings of prior art methods for the measurement of actual k-space trajectories, such measurements are only made for a limited number of scan orientations and field of views. Imaging in other orientations or with other field of views suffers from significant errors due to k-space trajectory deviations. Thus, there exists a need for a technique that can measure k-space trajectories in situ to allow imaging in arbitrary orientations that best fit the requirements of each particular study.

SUMMARY OF THE INVENTION

The present invention provides a novel technique for the measurement of k-space trajectory. This technique determines the actual k-space trajectory from phase values of acquired magnetic resonance signals collected for a plurality of excited slices. The correct k-space locus at each readout point is calculated from corresponding phase difference between acquired magnetic resonance signals of adjacent slices.

The measurements of k-space trajectories are made from the imaged subject/object directly and occurs in a few seconds or less using a few readout lines. The invention provides an accurate set of data for correcting image errors caused by non-ideal sample trajectories in magnetic resonance imaging (MRI) exams that employ scan techniques sensitive to sample trajectory deviations, illustratively including echo planar imaging and fast spiral scan techniques, thereby increasing the sensitivity and specificity of the MRI exams. The present invention also improves response of spatially and spectrally selective excitations in MRI.

The method of the present invention is suitable for trajectory measurement in magnetic resonance spectroscopy and includes acquiring signal from a plurality of excited regions, each region having a spin density function and a cumulative phase shift associated therewith. Thereafter, an excited region gradient amplitude is determined and a second excited region is scanned at a known separation from a first excited region. A k-space trajectory for the first excited region at a predetermined time relative to the second excited region is determined in addition to a difference in the accumulated phase shift between the regions. A k-space trajectory is then extracted therefrom. The present invention is useful in calculating magnetic resonance images.

DETAILED DESCRIPTION OF THE PREFERRED EMBODIMENT OF THE PRESENT INVENTION

Figure 1:
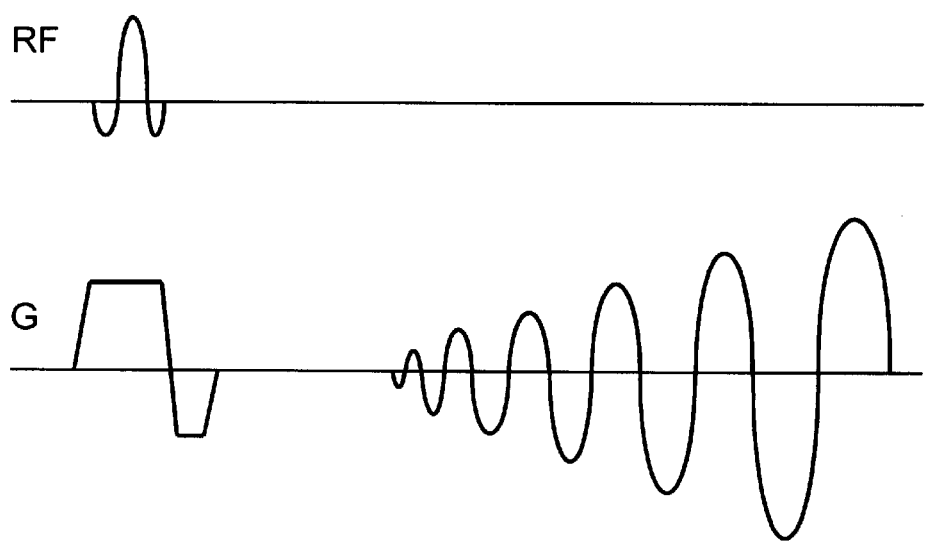
FIG. 1 is a pulse protocol operative in the present invention to measure an interleaf of a test spiral gradient waveform.

The present invention includes a novel k-space trajectory measurement method suitable for studies of homogeneous and inhomogeneous subjects. The present invention is notably faster than prior art methods requiring only a few readout lines to determine k-space trajectories. Post-acquisition data manipulation is largely obviated by the present invention because scan times for measuring each gradient channel require only a few seconds and k-space trajectories are measured directly at the readout points. Further, k-space trajectories are directly measured by scanning the test subject, allowing image gradients to be measured immediately before an actual imaging session. Immediately preceding measure of image gradients before an actual test imaging session allows for selection of arbitrary and uncalibrated scan orientation, field of view and similar operational parameters.

While the present invention is detailed herein in reference to slices normal to an arbitrary axis, it is appreciated that other shape and dimensionality signal sampling regions are readily devised.

In the process of the present invention, signals from an excited slice normal to the x axis at $x=x_0$ are acquired. In order to acquire this signal, the spatially varying $B_0$ field inhomogeneity and relaxation effects are neglected and an infinitely thin slice thickness is assumed. The formula for the slice is:

$$S_0(t) = e^{-jx_0 k_x(t) - j\phi(t)} \int \rho(x_0, y, z) e^{-jy k_x(t)} dy dz \qquad (1)$$

In the preceding formula $\rho(x_0, y, z,)$ is the spin density function over the excited slice at $x_0$, $\phi(t)$ is the accumulated phase shift induced by temporal $B_0$ field shifts and $k_x(t)$ is the k-space trajectory being measured. The $k_x$ trajectory is explicitly encoded in the phase of the acquired data.

In order to extract the $k_x(t)$ from the phase values of the acquired signal shown in Equation (1), two closely placed slices at $x=x_1$ and $x=x_2$ are acquired and $k_x(t)$ is then determined by the phase differences of acquired signals from the excited slices.

The slice located at $x_1$ and $x_2$ in Equation 2:

$$k_x(t) = \frac{\angle S_2(t) - \angle S_1(t)}{x_1 - x_2} \qquad (2)$$

is determined by combination of the slice selective gradient amplitude and modulation frequency of the slice selective radio frequency excitation pulse. The errors and their determinations cause the calculated $k_x(t)$ to be scaled.

The precise radio frequency modulation is achieved with radio frequency electronics which are well known in the art. This allows the slice locations to be determined in an accurate and precise way. The deviations in slice profile have a limited effect on the calculated $k_x(t)$ since both $\angle S_1(t)$ and $\angle S_2(t)$ are affected similarly by slice profile deviations.

In the preferred embodiment, the imaged object is relatively uniform in the measured gradient direction over the small distance of the selected slice gap. The gradient field and the $B_0$ shift are explicitly modeled in relation to the phase evolution of the acquired data in Equation 2. Spatially varying $B_0$ field inhomogeneity is not addressed in the equation since the overall phase difference produced by it is insignificant in comparison to the normal phase difference equal to the product of the slice gap and the test gradient amplitude. In instances where severe field inhomogeneity exists in the imaged object, additional data may be needed to explicitly measure its contribution to the overall phase changes. In the preferred embodiment the data sampling is along a single axis (i.e. $k_x$, $k_y$ or $k_z$) and acquired signals are of high signal to noise ration to ensure the accuracy of the k-space trajectory determination.

Once the $k_x(t)$ has been determined, the accumulated phase shift induced by temporal $B_0$ field shifts can be solved iteratively, with $\phi_x(0)=0$, $$\phi_x(t_i)=\phi_x(t_{i-1})+\angle S_1(t_i)-\angle S_1(t_{i-1})+x_1(k_x(t_{i-1})-K_x(t_i)) \quad (3)$$

$k_y(t)$ and $\phi_y(t)$ can be measured similarly with slices excited normal to the Y axis. The overall phase accumulation due to $B_0$ shift is:

$$\phi(t)=\phi_x(t)+\phi_y(t) \quad (4)$$

The accuracy of the measured k-space trajectories is determined by subjecting different test objects to the same magnetic gradients. A six-interleaved spiral cage trajectory is measured by the present invention using the pulse protocol of FIG. 1. Test subjects included a human head sized round flask containing an ion doped gel and a normal human subject, as described in Examples 2 and 3, respectively. The accuracy of the measured k-space trajectories according to the present invention is assessed by measuring the same spiral k-space trajectories according to the "small phantom" technique (6). The pulse sequence of FIG. 1 used herein acquires the single slice data successively. Data from adjacent slices are acquired successively within a TR period, with adjacent slice spacing selected by adjusting RF modulation frequency. The relative effect of spatially varying $B_0$ field inhomogeneity on k-space trajectory measurement accuracy is assessed by repeating the pulse protocol without applying test gradient waveforms.

Figure 2:
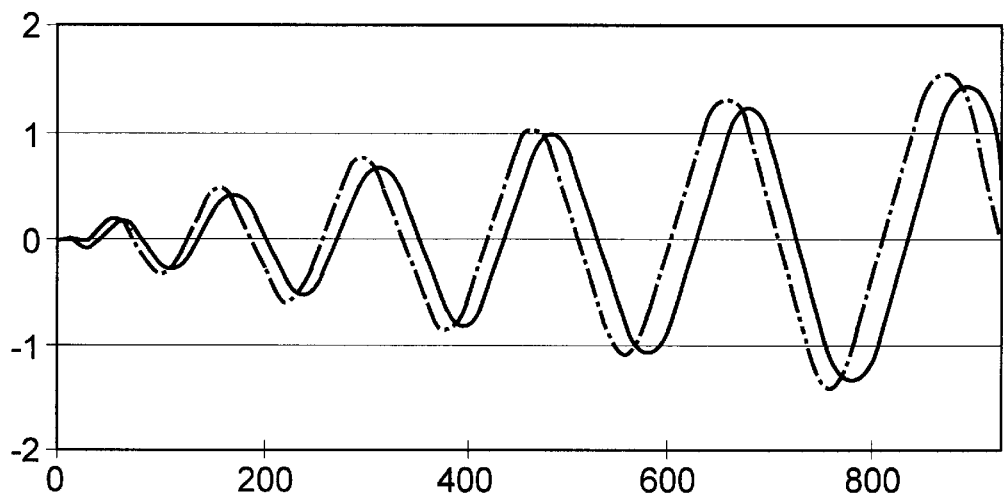
FIG. 2 is a graph showing the $k_x$ trajectory of a spiral interleaf measured from the pulse protocol of FIG. 1 using a spherical gel phantom and using a human subject. In comparison, the same trajectory as measured by the "small phantom" method is also plotted in FIG. 2. The ideal trajectory of this interleaf is shown in FIG. 2 as the shaded curve.
Figure 3:
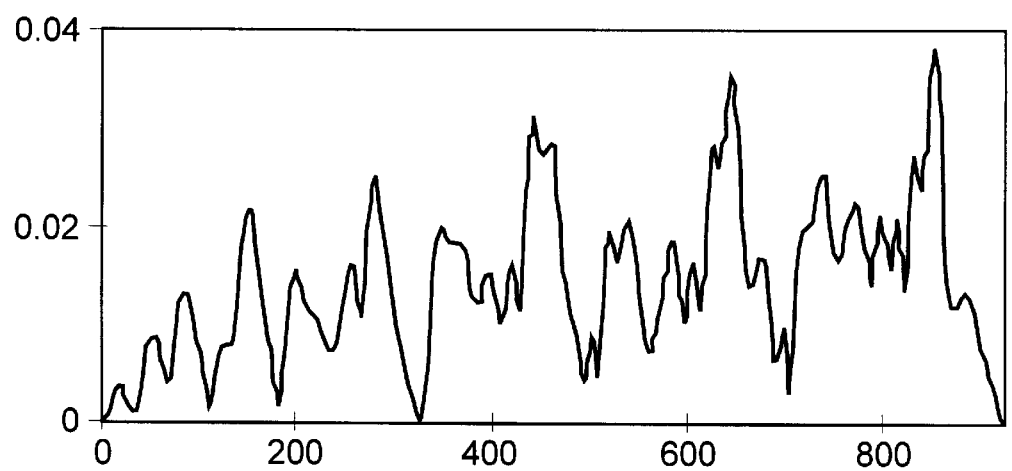
FIG. 3 is a graph showing the maximum difference between the $k_x$ trajectories measured by the present invention using the gel phantom and using the human subject, displayed at an amplitude scale 25 times that of FIG. 2.
Figure 4:
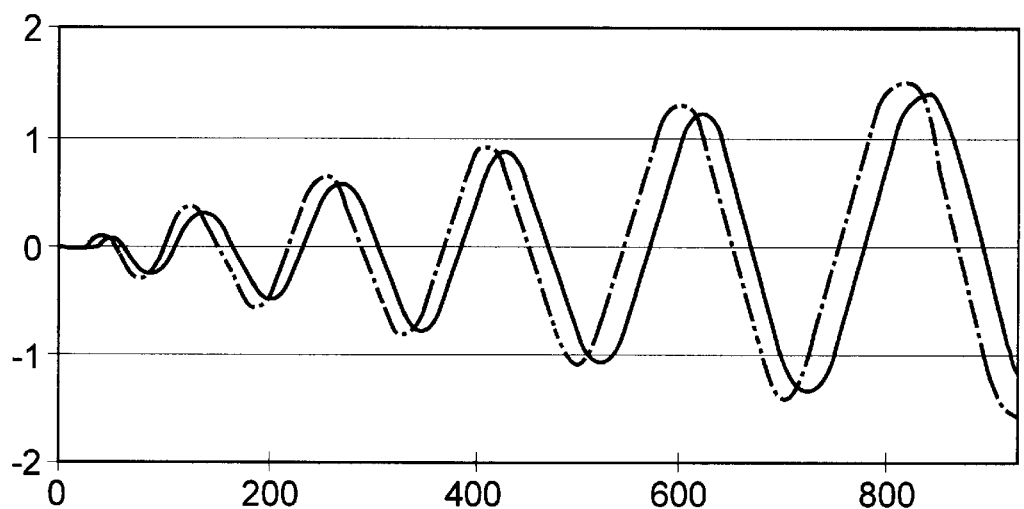
FIG. 4 is a graph showing the $k_y$ trajectory of the spiral interleaf measured from the pulse protocol of FIG. 1 using a spherical gel phantom and using a human subject. The same trajectory as measured by the "small phantom" method is also plotted in FIG. 4. The ideal trajectory of this interleaf is shown in FIG. 4 as the shaded curve.
Figure 5:
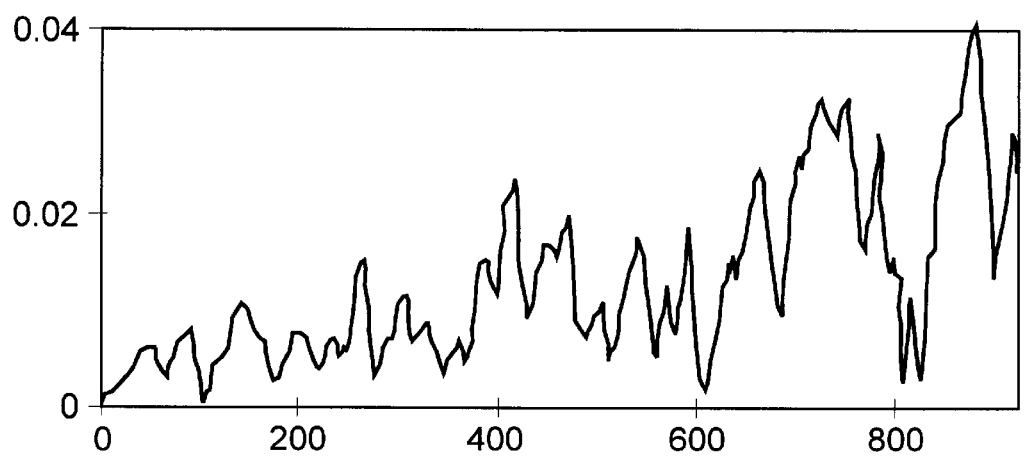
FIG. 5 is a graph showing the maximum difference between the $k_y$ trajectories measured by the present invention using the gel phantom and using the human subject, displayed at an amplitude scale 25 times that of FIG. 4.

The k-space trajectories measured by the "small phantom" method (6), and by the present invention using a gel phantom and a human head are shown in FIG. 2. These $k_x$ trajectories are obtained through application of the pulse protocol of FIG. 1. The ideal trajectory is plotted as a shaded curve in FIG. 2. The measured trajectories overlap to the extent that they appear as a single curve in FIG. 2. The maximal difference among the $k_x$ trajectories measured by the "small phantom" method, by the present invention using the gel phantom and a human subject is shown in FIG. 3 with a graph amplitude magnified twenty-five times with respect to that of FIG. 2. Similar results for measurement of $k_y$ are shown in FIGS. 4 and 5, respectively. Phase variations associated with spatially varying $B_0$ field inhomogeneity is inconsequential compared to that produced by test gradients.

Figure 6:
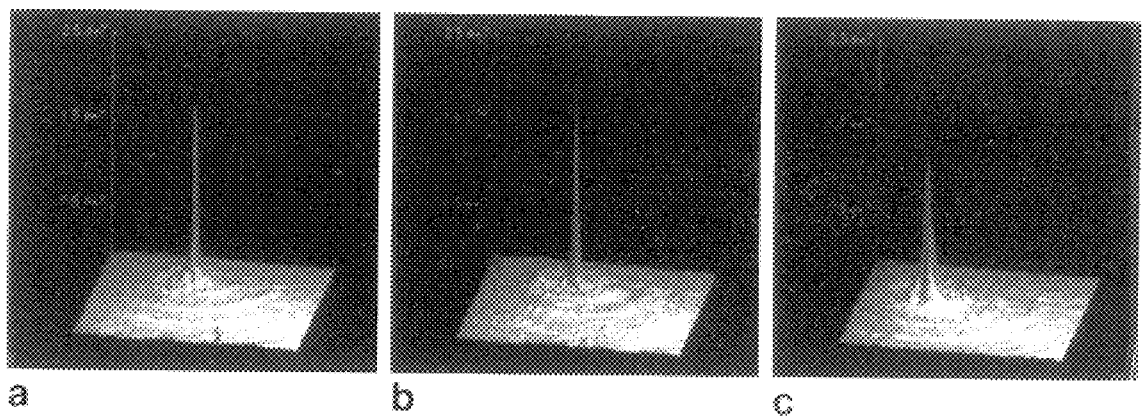
FIG. 6 shows images of a small phantom reconstructed using k-space trajectories (a) measured by the present invention, (b) measured by the "small phantom" method, and (c) the ideal trajectory.

Image reconstructions using measured and ideal spiral k-space trajectories are instructive in assessing sample location misregistrations. Images of a small phantom, reconstructed using k-space trajectories measured by the present invention, by the "small phantom" method and using the ideal trajectories are shown in FIG. 6. A comparison of the point spread like functions in FIGS. 6a and 6b demonstrates that reconstructed images are improved after k-space sample location misregistrations have been taken into account. In contrast, FIG. 6c shows that a large amount of energy is spread over regions away from the reconstructing point. Further, the central peak's full width at half maximum in FIG. 6 is comparatively broad, indicating strong local smearing in the resulting reconstructed images.

Figure 7:
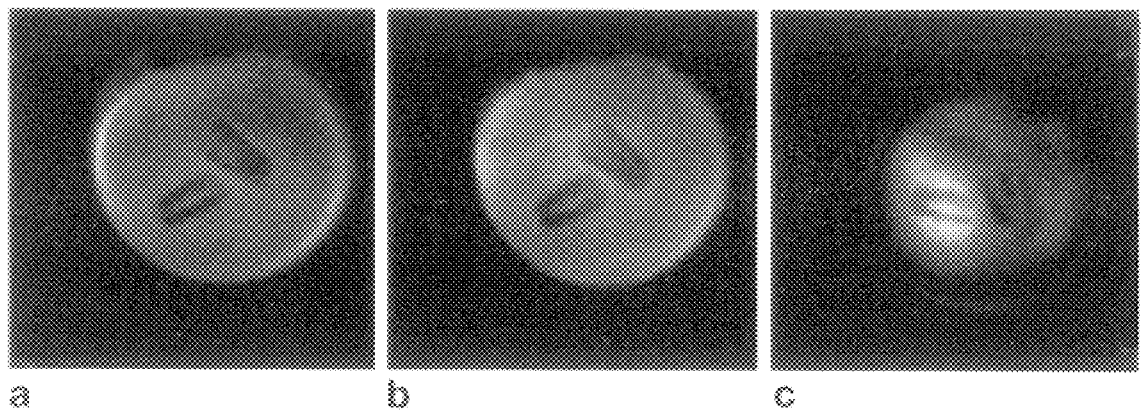
FIG. 7 shows spiral images (64×64) of a spherical gel phantom reconstructed using k-space trajectories (a) measured according to the present invention, (b) measured by the "small phantom" method, and (c) the ideal trajectory.
Figure 8:
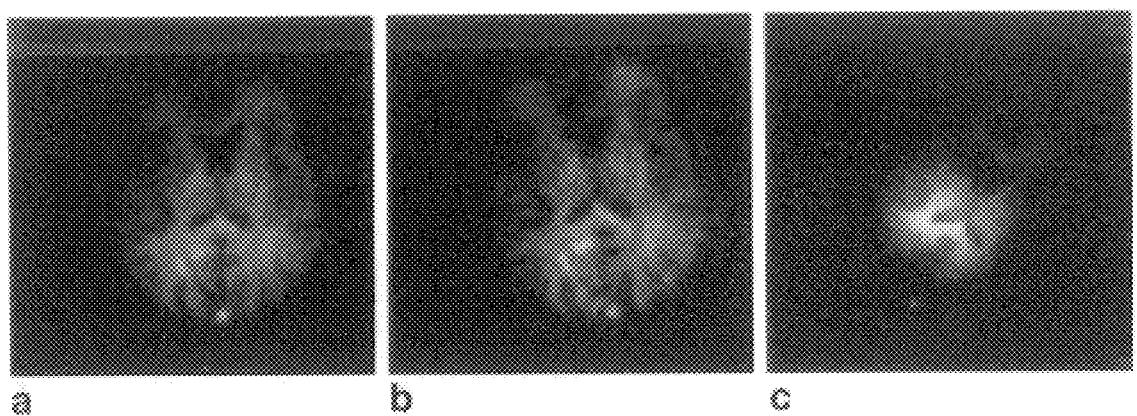
FIG. 8 shows spiral images (64×64) of a human head reconstructed using k-space trajectories (a) measured according to the present invention, (b) measured by the "small phantom" method, and (c) the ideal trajectory.

Spiral images of a gel phantom reconstructed using k-space trajectories measured by the present invention from the phantom, measured by the "small phantom" method (6), and the ideal trajectories are shown in FIG. 7. Similarly, FIG. 8 shows human head images reconstructed using k-space trajectories measured by the present invention, measured by the "small phantom" method (6), and the ideal trajectories. The spiral images of the ideal trajectory shown in FIGS. 7c and 8c show the effects of k-space sample location misregistration. The spiral image quality obtained from the present invention, as shown in FIGS. 7a and 8a, is considerably improved as compared to that from the small phantom method as shown in FIGS. 7b and 8b, respectively. The present invention shows considerable improvements in regard to edge definition, as compared to the small phantom method.

While spatially varying $B_0$ field inhomogeneity in the excited slices is largely inconsequential when measuring a well shimmed subject, it is appreciated that a subject with large spatially varying field inhomogeneity and/or spatially varying eddy currents, separate measurement of phase perturbations in the presence of a zero or negligible applied test gradient is optionally conducted.

It is appreciated that in those applications where cross plane dephasing is of concern, the present invention is readily modified to use excited pencils, instead of slices, in order to measure $k_x$ and $k_y$ simultaneously. Conventional pulse protocols are capable of producing two-dimensional sampling pencils.

In general, the k-space trajectory measurement technique of the present invention enables practical k-space calibration for any imaging applications that are affected by misregistration of k-space sample locations caused by either eddy currents, gradient amplifier performance imperfections, or readout timing errors.

The following examples are set forth to illustrate various embodiments of the present invention. These examples are not intended to limit the scope of the present invention as set forth in the appended claims.

EXAMPLE 1

Pulse Generation and Spiral k Trajectory Measurement

A six interleaf k trajectory is measured using a quadrature volume head RF coil. Each spiral interleaf contains 925 readout points. Readout duration is 11.25 milliseconds. Measurements are performed on a Philips/UAB 4.1-T whole body scanner equipped with a Magnex (Abingdon, England) self-shielded whole body gradient set. Maximum gradient strength is 2.5 gauss per centimeter and the maximum gradient slow rate is greater than 2,500 gauss per centimeter per second. Gradient pre-emphases are determined separately using an RF pulse applied at successive delays after a trapezoidal gradient pulse as shown in FIG. 1. The sequence is repeated four times successively in a single TR period to acquire data from four adjacent slices with a different slice being selected by changing the RF modulation frequency. Gradient pre-emphases time constants are adjusted recursively to minimize eddy current effects observed in the acquired free induction decay signals.

EXAMPLE 2

K Trajectory Measurement of Gel Phantom Subject According to the Present Invention A 2 liter round flask is filled with 2% agar gel containing 4 millimolar copper sulfate and allowed to congeal. Scan time of relaxation (TR) is 500 milliseconds. Time of excitation (TE) is 10 milliseconds. Excitation angle is 60 degrees. Field of view (FOV) is 22 centimeters. Ten dummy scans are conducted as part of the scan parameters. The $k_x$ trajectory is measured at four slices in the x direction at locations of −6 millimeters, −3 millimeters, 0 millimeters and 3 millimeters with an excited slice thickness of 3 millimeters. The scan time for the entire experiment is 8 seconds.

EXAMPLE 3

K Trajectory Measurement of Human Head Subject According to the Present Invention The procedure of Example 2 is repeated, substituting the head of a human volunteer for that of the round flask.

EXAMPLE 4

Acquisition of Gradient Echo Images From Spiral Imaging Gradients

64×64 spiral gradient-echo images are obtained from the gel phantom using k-space trajectory measurements as per Example 2. Acquired data is first phase corrected using the measured phase acquisition due to $B_0$ shift. Images are reconstructed by regridded interpolation and fast Fourier transform (13). Images are obtained using the same 4.1 -T scanner of Example 2, using the quadrature volume RF coil. Image scan parameters are as follows: TE=10 milliseconds, TR=500 milliseconds, number of experiments (NEX)=1, FOV=22 centimeters, and slice thickness=5 millimeters.

EXAMPLE 5

64×64 spiral gradient-echo images are obtained from a human head subject using k-space trajectory measurements as per Example 3. Images are collected according to the parameters of Example 4 with the exception that TR=2,500 milliseconds and in the human study, inversion pulses are applied 700 milliseconds before the gradient echo imaging sequence to enhance the contrast between gray and white matter.

The present invention having been described in its preferred embodiments, it is appreciated that those skilled in the art are capable of recognizing numerous modifications and embodiments of the present invention without departing from the scope of this invention. Accordingly, the scope of the present invention is defined as set forth by the following claims. All references cited herein are intended to be incorporated to the same extent as if each reference was explicitly incorporated by reference.

REFERENCES

1. T. Onodena et al., *J. Phys. K. Sci. Instrum.* 20:416 (1987).
2. A. Takahashi et al., *Magn. Reson. Med.* 34:448 (1995).
3. M. T. Alley et al., Proc. ISMRM, 4th Annual Mtg., New York, USA (1996), 1408.
4. A. B. Kerr et al., Proc. ISMRM, 3rd Annual Mtg., Nice, FRA (1995), 622.
5. N. Papadakis et al., *Magn. Reson. Imaging* 25:567 (1987).
6. G. Mason et al., *Magn. Reson. Med.* 25:482 (1997).
7. H. K. Lee et al., Proc. ISMRM, 4th Annual Mtg., New York, USA (1996), 1388.
8. W. M. Luh et al., Proc. ISMRM, 3rd Annual Mtg., Nice, FRA (1995), 621.
9. S. Ljunggren, *J. Magn. Reson.* 64:236 (1983).
10. C. C. Gudu et al., Proc. ISMRM, 4th Annual Mtg., New York, USA (1996), 1405.
11. T. C. Reese et al., *J. Magn. Reson.* 4:569 (1994).
12. D. M. Spielman et al., *Magn. Reson. Med.* 34:580 (1995).
13. J. I. Jackson et al., *IEEE Trans. Med. Imaging* 10:475 (1991).

I claim:

1. A method for trajectory measurement in magnetic resonance spectroscopy comprising the steps of:

acquiring signals from a plurality of excited regions, each region having a spin density function and an accumulated phase shift;

determining an excited region gradient amplitude;

locating a first excited region relative to a second excited region;

determining a k-space trajectory of the first excited region data at a predetermined time relative to the second excited region data;

determining a difference in the accumulated phase shift between the first excited region and the second excited region; and extracting the k-space trajectory from the excited region data.

2. The method of claim 1 wherein the first and second regions are spatially adjacent.

3. The method of claim 1 further comprising determining k-space trajectory errors associated with a field inhomogeneity.

4. The method of claim 3 wherein determining k-space trajectory errors is accomplished by measuring a phase perturbation in the presence of a zero region gradient.

5. The method of claim 3 wherein determining k-space trajectory errors is accomplished by measuring field inhomogeneity differences between the excited regions.

6. The method of claim 1 wherein said plurality of regions are slices normal to an axis.

7. The method of claim 6 wherein the axis is x-axis and the first excited slice data at $x=x_0$ satisfies $$S_0(t)=e^{-jx_0k_x(t)-j\Phi(t)}\int \rho(x_0,y,z)e^{-jyk_x(t)}dydz$$

where $\rho(x_0,y,z)$ is a spin density function over the first excited slice at $x_0$, $\Phi(t)$ is an accumulated phase shaft, and $k_x(t)$ is a k-space trajectory.

8. The method of claim 6 wherein the difference in the accumulated phase shift between the first and second excited slices $\angle S_2(t) - \angle S_1(t)$ as a function of time satisfies $$k_x(t) = \frac{\angle S_2(t) - \angle S_1(t)}{x_1 - x_2}$$

where $k_x(t)$ is k-space trajectory, $x_1$ is a position corresponding to the first excited slice and $x_2$ is a position corresponding to the second excited slice.

9. The method of claim 1 wherein said plurality of regions are pencils normal to an axis and a second orthogonal axis.

10. A magnetic resonance image processed according to the method of claim 1.

11. The magnetic resonance image of claim 10 wherein the image is a spiral scanning image.

12. The magnetic resonance image of claim 10 wherein the image is an echoplanar image.

13. A method for trajectory measurement in magnetic resonance spectroscopy comprising the steps of:

acquiring signal from a plurality of adjacent excited slices normal to an axis, each slice having a spin density function and an accumulated phase shift wherein the excited slice normal to the x-axis at arbitrary position $x=x_0$ satisfies $$S_0(t)=e^{-jx_0k_x(t)-j\Phi(t)}\int \rho(x_0,y,z)e^{-jyk_x(t)}dydz$$

where $\rho(x_0,y,z)$ is a spin density function over the first excited slice at $x_0$, $\Phi(t)$ is an accumulated phase shaft, and $k_x(t)$ is a k-space trajectory;

determining a slice gradient amplitude;

locating the x=$x_0$ excited slice relative to a second excited slice;

determining a k-space trajectory of the x=$x_0$ excited slice at a predetermined time relative to the second excited slice;

determining a difference in the accumulated phase shift between the x=$x_0$ excited slice and the second excited slice $\angle S_2(t) - \angle S_1(t)$ as a function of time according to $$k_x(t) = \frac{\angle S_2(t) - \angle S_1(t)}{x_1 - x_2}$$

where $\rho(x_0,y,z)$ is a spin density function over the x=$x_0$ excited slice at $x_0$, $\Phi(t)$ is an accumulated phase shaft, and $k_x(t)$ is a k-space trajectory; and extracting the k-space trajectory from the excited slice data.

* * * * *